(12) United States Patent
Inui

(10) Patent No.: US 8,878,267 B2
(45) Date of Patent: Nov. 4, 2014

(54) SOLID-STATE IMAGING DEVICE

(75) Inventor: Fumihiro Inui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/807,207

(22) PCT Filed: Jun. 27, 2011

(86) PCT No.: PCT/JP2011/003643
§ 371 (c)(1),
(2), (4) Date: Dec. 27, 2012

(87) PCT Pub. No.: WO2012/001939
PCT Pub. Date: Jan. 5, 2012

(65) Prior Publication Data
US 2013/0105871 A1 May 2, 2013

(30) Foreign Application Priority Data

Jul. 2, 2010 (JP) ................................ 2010-151973

(51) Int. Cl.
*H01L 31/062* (2012.01)
*H04N 5/335* (2011.01)
*H01L 27/146* (2006.01)

(52) U.S. Cl.
CPC ..... *H01L 27/14643* (2013.01); *H01L 27/14636* (2013.01); *H01L 27/14609* (2013.01); *H01L 27/14632* (2013.01); *H01L 27/14634* (2013.01); *H01L 27/1464* (2013.01)
USPC ........... 257/292; 257/184; 257/208; 257/291; 257/432; 257/447; 257/E27.13; 257/E27.132; 257/E27.133; 257/E31.097; 348/294; 438/59; 438/70

(58) Field of Classification Search
CPC ................... H01L 27/14643; H01L 27/14632; H01L 27/14636
USPC ................. 257/184, 208, 291, 292, 432, 447, 257/E27.13, E27.132, E27.133, E31.097; 348/294; 438/59, 70
See application file for complete search history.

(56) References Cited

U.S. PATENT DOCUMENTS

| | | | |
|---|---|---|---|
| 7,482,646 B2* | 1/2009 | Gao et al. | 257/292 |
| 8,570,409 B2* | 10/2013 | Choi et al. | 348/294 |
| 2010/0238331 A1* | 9/2010 | Umebayashi et al. | 348/294 |

FOREIGN PATENT DOCUMENTS

| | | |
|---|---|---|
| JP | 06-029762A A | 2/1994 |
| JP | 2001-160619 A | 6/2001 |

(Continued)

*Primary Examiner* — Dao H Nguyen
(74) *Attorney, Agent, or Firm* — Canon USA, Inc. IP Division

(57) ABSTRACT

A purpose of the present invention is to provide a preferable separation structure of wells when a photoelectric conversion unit and a part of a peripheral circuit unit or a pixel circuit are separately formed on separate substrates and electrically connected to each other. To this end, a solid-state imaging device includes a plurality of pixels including a photoelectric conversion unit and a amplification transistor configured to amplify a signal generated by the photoelectric conversion unit; a first substrate on which a plurality of the photoelectric conversion units are disposed; and a second substrate on which a plurality of the amplification transistors are disposed. A well of a first conductivity type provided with a source region and a drain region of the amplification transistor is separated from a well, which is disposed adjacent to the well in at least one direction, of the first conductivity type provided with the source region and the drain region of the amplification transistor.

9 Claims, 10 Drawing Sheets

(56) References Cited

FOREIGN PATENT DOCUMENTS

| | | |
|---|---|---|
| JP | 2002-270807 A | 9/2002 |
| JP | 2003-142672 A | 5/2003 |
| JP | 2004-071683A A | 3/2004 |
| JP | 2004-129015A A | 4/2004 |
| JP | 2006-196729 A | 7/2006 |
| JP | 2008-0536330 A | 9/2008 |
| JP | 2008-235478 A | 10/2008 |
| JP | 2010-103547 A | 5/2010 |

* cited by examiner

SOLID-STATE IMAGING DEVICE

TECHNICAL FIELD

The present invention relates to a solid-state imaging device.

BACKGROUND ART

A solid-state imaging device is known in which a photoelectric conversion unit and a part of a peripheral circuit unit or a pixel circuit are separately formed on separate substrates and electrically connected to each other.

According to PTL 1, a light sensitive pixel and a through wiring are disposed on a first substrate and a readout circuit is disposed on a second substrate. The readout circuit reads out an electric signal via the through wiring and then outputs the electric signal as an image signal. In such a solid-state imaging device, another surface of the first substrate and the readout circuit on the second substrate are disposed to face each other, and terminals of the through wiring and the readout circuit are electrically connected to each other.

Further, according to PTL 2, the photoelectric conversion unit and the pixel circuit are disposed monolithically on the first substrate, and wells included in the photoelectric conversion unit are separated for each pixel.

Furthermore, according to PTL 3, the photoelectric conversion unit and the pixel circuit are disposed monolithically on the first substrate, and the well of a transistor for an amplifier is electrically separated from wells of other transistors included in the pixel.

CITATION LIST

Patent Literature

PTL 1: Japanese Patent Application Laid-Open No. 2008-235478
PTL 2: Japanese Patent Application Laid-Open No. 2006-196729
PTL 3: Japanese Patent Application Laid-Open No. 2001-160619

SUMMARY OF INVENTION

Technical Problem

According to the PTL 1, 2, and 3, when the photoelectric conversion unit and a part of the peripheral circuit unit or the pixel unit are separately formed on the separate substrates and electrically connected to each other, a preferable separation structure of the wells is not sufficiently discussed.

According to the PTL 2, in view of influence from charge leaked from the saturated pixel, the wells included in the photoelectric conversion unit are separated for each pixel. Thus, the PTL 2 describes nothing about the separation of the wells on the substrate on which the photoelectric conversion unit is not disposed when the separated substrates are adopted.

Further, according to the PTL 3, with a purpose for suppressing fluctuation of a threshold value caused by a substrate bias effect of the transistor for the amplifier included in the pixel, the well for the transistor amplifier is separated from the wells of other transistors included in the same pixel. However, the PTL 3 discusses nothing about the wells of the transistor for the amplifier included in other pixels.

A common problem between the PTL 2 and 3 is that, since the photoelectric conversion unit and the pixel circuit are disposed monolithically on the first substrate, an extra space is needed to separate the wells, thus reducing a light receiving area of the photoelectric conversion unit.

Solution to Problem

To solve the above-described problem, the present invention is directed to a preferable separation structure of wells when a photoelectric conversion unit and a part of a peripheral circuit unit or a pixel circuit are separately formed on separate substrates and electrically connected to each other.

The present invention includes: a plurality of pixels including a photoelectric conversion unit and a transistor amplifier configured to amplify a signal generated by the photoelectric conversion unit; a first substrate on which a plurality of the photoelectric conversion units are disposed; and a second substrate on which a plurality of the transistor amplifiers are disposed. A well of a first conductivity type provided with a source region and a drain region of the transistor amplifier is separated from a well, which is disposed adjacent to the well in at least one direction, of the first conductivity type provided with the source region and the drain region of the transistor amplifier.

Advantageous Effects of Invention

According to the present invention, a preferable separation structure of a well can be provided when a photoelectric conversion unit and a part of a peripheral circuit unit or a pixel circuit are separately formed on separate substrates and electrically connected to each other.

DESCRIPTION OF EMBODIMENTS

Figure 1A:
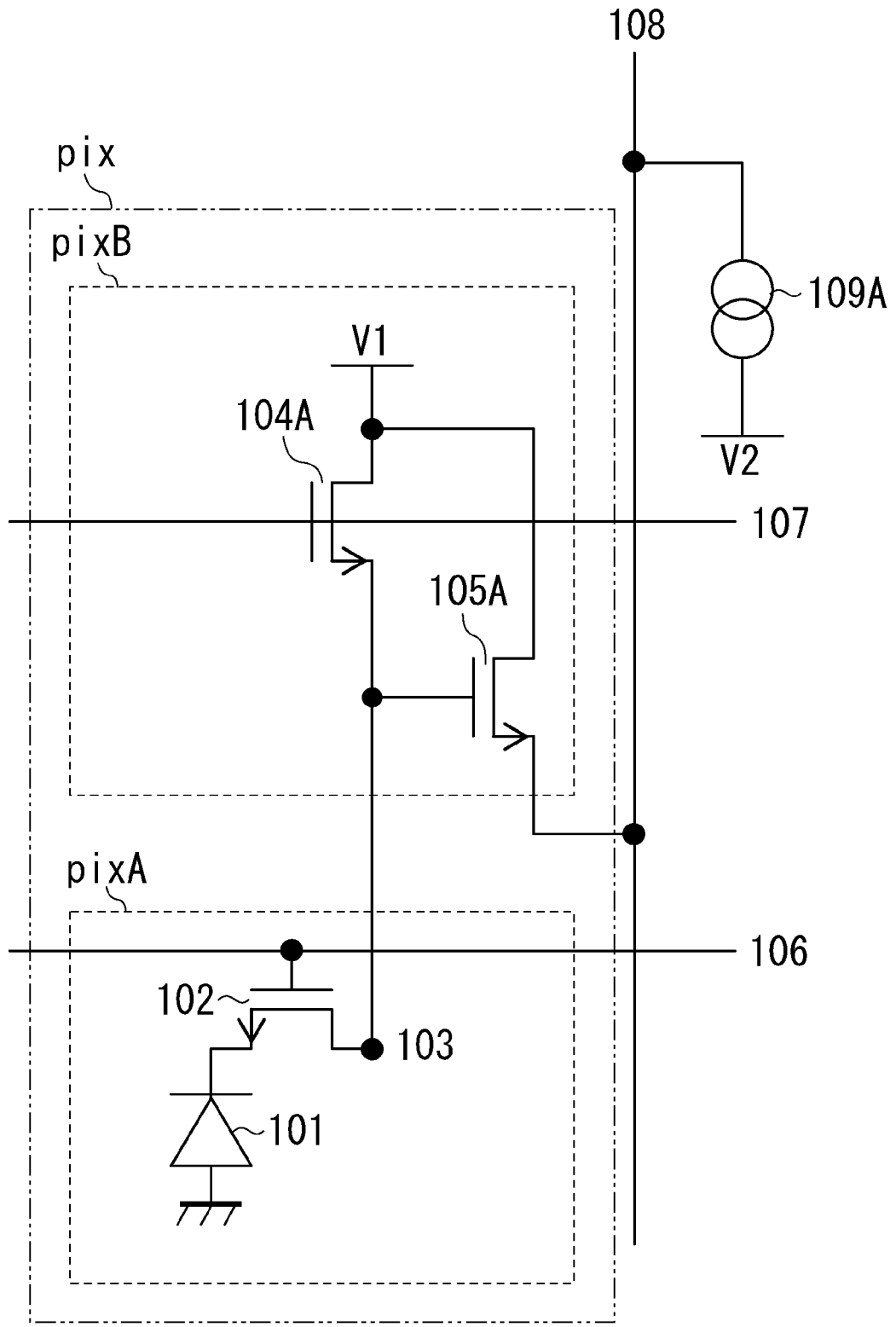
FIG. 1A is an example illustrating an equivalent circuit of a pixel according to the present invention.
Figure 1B:
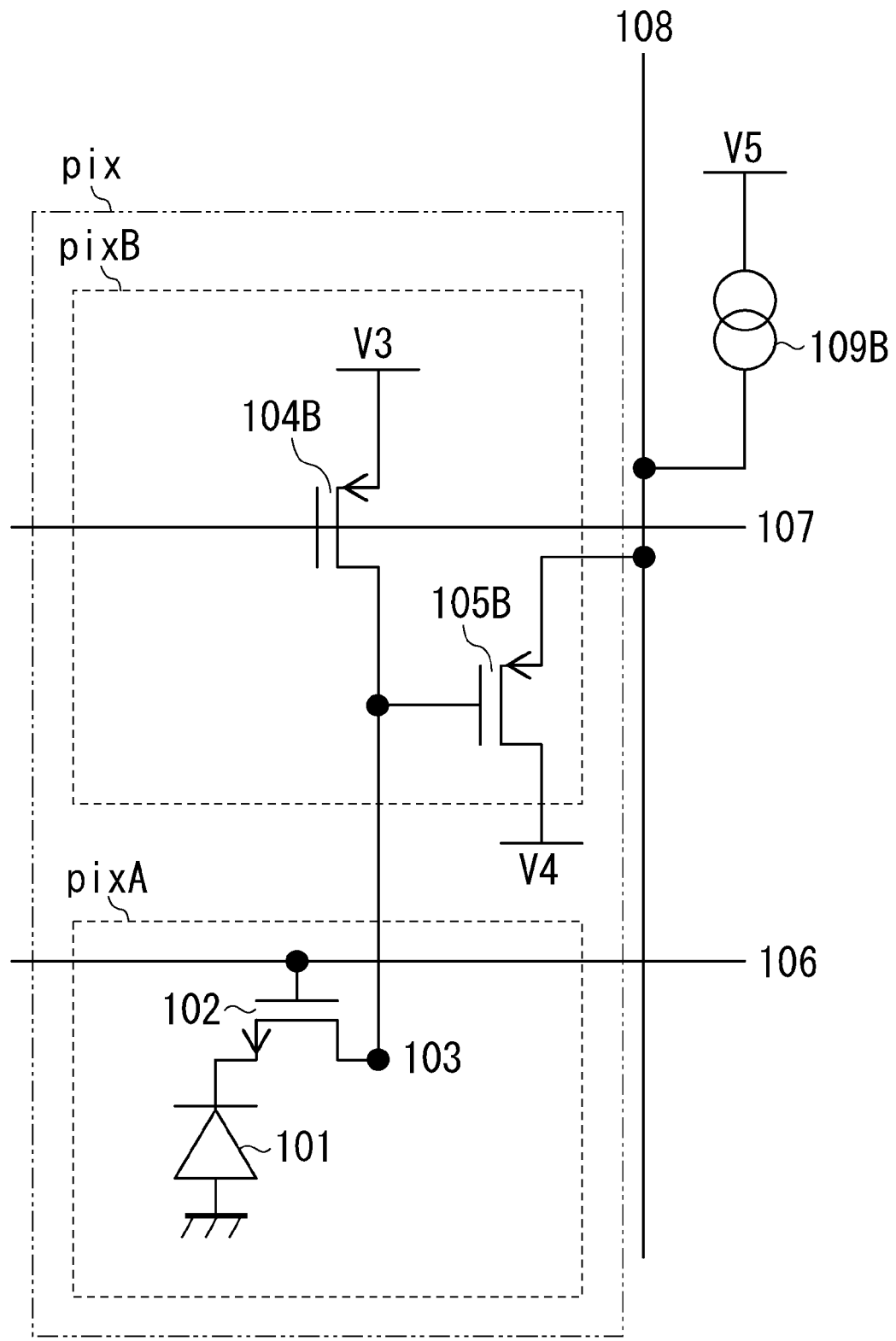
FIG. 1B is an example illustrating an equivalent circuit of a pixel according to the present invention.

FIGS. 1A and 1B are examples of an equivalent circuit of one pixel included in a solid-state imaging device that can be applied to the present exemplary embodiment. Herein, only one pixel is illustrated, however, actually a plurality of pixels are disposed to configure a pixel arrangement.

A photoelectric conversion unit 101 generates holes and electrons by photoelectric conversion using, for example, a photodiode.

A transfer unit 102 transfers charge of the photoelectric conversion unit 101 using, for example, a metal oxide semiconductor (MOS) transistor (transfer transistor).

The transfer unit 102 transfers to a floating diffusion (FD) 103 the charge of the photoelectric conversion unit 101, of which potential is in a floating state.

A pixel reset unit 104 sets at least the potential of the FD 103 to a reference potential. In other words, the pixel reset unit 104 resets the voltage of an input node of a transistor amplifier. Alternatively, the pixel reset unit 104 is turned on simultaneously with the transfer unit 102 to set the potential of the photoelectric conversion unit 101 to the reference potential. As the pixel reset unit 104, for example, a MOS transistor (reset transistor) is used.

A pixel amplifier 105 amplifies a signal based on either of paired charge generated in the photoelectric conversion unit 101 and outputs the signal using, for example, the MOS transistor. In this case, a gate of the MOS transistor (amplification transistor) of a pixel amplifier is electrically connected to the FD 103.

A transfer control line 106 is used to control an operation of the transfer transistor. A reset control line 107 is used to control an operation of the reset transistor. A driving pulse is supplied from a vertical scanning circuit (not illustrated) to the control lines described above.

Signals amplified by a plurality of pixel amplifiers included in a pixel column are sequentially output to a vertical output line 108.

A current source 109 is used to supply a bias current to the pixel amplifier 105. In the circuit according to the present exemplary embodiment, the current source 109 supplies the bias current for causing the amplification MOS transistor to work as a source follower operation.

In FIG. 1A, a voltage V1 is supplied to a drain of the amplification transistor and the reset transistor. Herein, a common voltage is supplied, however, the voltage can be supplied from separate power sources. A voltage V2 is supplied to a current source 109A illustrated in FIG. 1A.

In FIG. 1B, a voltage V3 is supplied to the drain of the reset transistor. In FIG. 1B, a voltage V4 is supplied to the drain of the amplification transistor. In FIG. 1B, a voltage V5 is supplied to a current source 109B.

Of elements included in the pixel, pixA indicates a portion disposed on a first substrate and pixB indicates a portion disposed on a second substrate. A pixel pix includes the pixA and the pixB.

Differences between FIGS. 1A and 1B will be described. Characters "a" and "b" are added to different members to distinguish them. More specifically, the amplification transistor and the reset transistor have different conductivity types. In FIG. 1A, a negative channel metal oxide semiconductor (NMOS) transistor is used and, in FIG. 1B, a positive channel metal oxide semiconductor (PMOS) transistor is used. Corresponding to each transistor type, the voltages supplied to the transistor and the current source are different.

In FIG. 1A, the voltage V1 is a power source voltage of 5V or 3.3V, for example. The voltage V2 is lower than the voltage V1 and, has a ground potential, for example. On the other hand, in FIG. 1B, the voltages V3 and V4 have relatively low potentials, for example, the ground potential, and the voltage V5 is 3.3V, which is higher than the voltage V3 of 1.8V.

In FIG. 1B, the PMOS transistor is used as the amplification transistor. The photoelectric conversion unit 101 uses electrons as signal charge. When an amount of incident light is large, the gate potential of the PMOS transistor is lowered.

According to the lowered gate potential, the source potential of the PMOS transistor tends to rise compared to when it is dark. More specifically, when the signal amplitude is large compared to that when resetting, the vertical output line can be driven with a higher driving power. Therefore, compared with the structure illustrated in FIG. 1A, the structure illustrated in FIG. 1B has an advantage in its reading speed.

Such a configuration has been conventionally disposed on the same substrate. Thus, for example, to separate the wells within the pixel makes the structure complicated. On the other hand, as the present exemplary embodiment, the circuits are separately formed on the separate substrates to solve such problems. Further, an operation voltage range illustrated in FIG. 1B can be reduced, thereby having an advantage of lowering the power supply voltage.

The advantage does not lie with using the PMOS transistor as the amplification transistor but using a transistor having opposite polarity of the signal charge. In other words, when the signal charge includes the electrons, the PMOS transistor is used as the amplification transistor and the reset transistor. When the signal charge includes holes, the NMOS transistor is used.

In respect of the conductivity type of the transfer transistor, the MOS transistor of a first conductivity type is used as the transfer transistor, and the transistors of a second conductivity type that is the opposite type of the first conductivity type are used as amplification transistor and the reset transistor.

As described above, the structure of the pixel has been described, however, the structure is not limited thereto. For example, as the amplification transistor, a junction field effect transistor (JFET) can be used. Further, the photoelectric conversion unit may use the holes as the signal charge. In this case, the PMOS transistor is adopted as the transfer transistor.

Further, a plurality of photoelectric conversion units may share the amplification transistor and reset transistor. Furthermore, a selection transistor may be separately used connected in series with the amplification transistor.

Furthermore, a structure in which the pixel components are separately formed on a plurality of substrates is not limited to the example described above. In addition to the structure described above, the reset transistor and the amplification transistor may be disposed on the first substrate. Furthermore, the amplification transistor and the reset transistor are not disposed in the pixel, but the transfer transistor may directly output the charge of the photoelectric conversion unit to the vertical output line.

Figure 2:
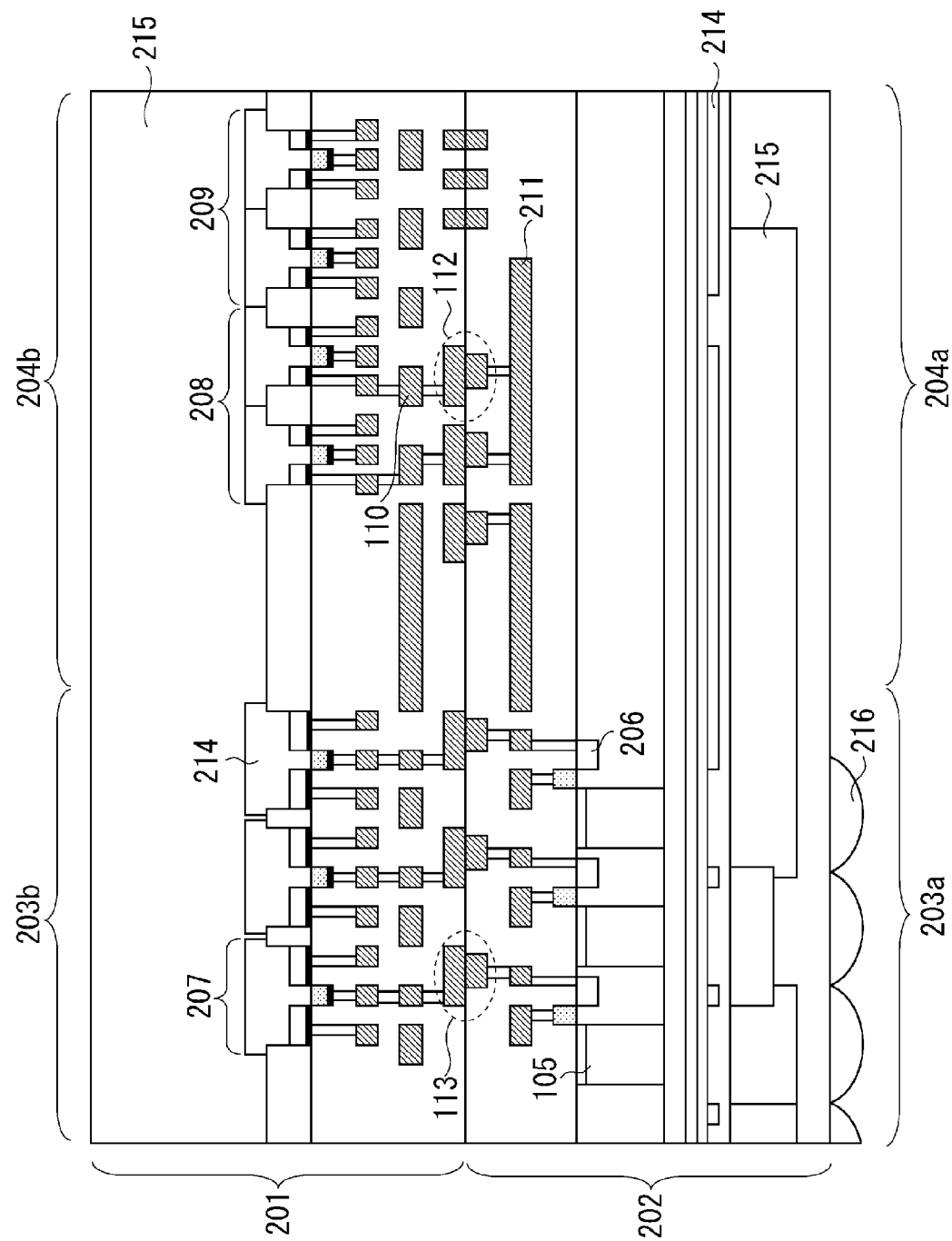
FIG. 2 is a schematic cross-sectional view illustrating a solid-state imaging device according to the present invention.

FIG. 2 is an example of a schematic sectional view illustrating electrically-connecting portions of the first and second substrates that can be commonly adopted to the solid-state imaging device according to the present invention.

A pixel region 203a is disposed on the second substrate 202. A pixel region 203b is disposed on a first substrate 201. A second peripheral region 204a is disposed on the second substrate 202. The second peripheral region 204a is disposed outside the pixel region 203a.

A first peripheral region 204b is disposed on the first substrate 201. The first peripheral region 204b is disposed outside the pixel region 203b, and a circuit for processing a signal output from the pixel region 203b via a common output line or controlling a signal output from the pixel region is disposed.

FIG. 2 illustrates a pixel amplifier 105, a FD 206, and a amplification transistor 207. The gate of the amplification transistor 207 and the FD 206 are electrically connected to each other. Herein, only the amplification transistor 207 is illustrated as the pixel circuit, however, additionally, the above-described reset transistor is included in the pixel circuit.

A MOS transistor 208 constitutes a part of the readout circuit disposed in the first peripheral region 204b. An example of the readout circuit includes a parallel processing circuit for processing in parallel the signals read from each column of a plurality of pixel columns. Such a parallel processing circuit includes a column amplifier and a column AD converter. A MOS transistor 209 constitutes a circuit other than the parallel processing circuit disposed in the first peripheral region 204b.

A first conductivity pattern 110 constitutes a current voltage supply wiring for supplying a direct current voltage to the MOS transistors 209 constituting the parallel processing circuit. The first conductivity pattern 110 extends in a direction of a depth of a paper surface and supplies the direct current voltage to the MOS transistors of each parallel processing circuit in common. The first conductivity pattern 110 is disposed outside the pixel region 203b.

A second conductivity pattern 211 is disposed outside the pixel region 203a on the second substrate 202.

An electrically-connecting portion 112 electrically connects the first conductivity pattern 110 and the second conductivity pattern 211. For example, the electrically-connecting portion 112 can be constituted by forming the conductivity pattern with a top wiring layer on the first substrate 201 and that on the second substrate 202 and by electrically connecting them to each other.

The second conductivity pattern 211 is disposed in the second peripheral region 204a on the second substrate 202. The second peripheral region 204a includes less circuit elements compared to those disposed in the first peripheral region 204b on the first substrate 201, or no circuit elements at all. Thus, since layout can be comparatively freely performed, an area of the second conductivity pattern 211 is preferably made larger than that of the first conductivity pattern 110 to decrease a resistance value while maintaining free wiring layout on the second substrate 202.

An electrically-connecting portion 113 electrically connects the FD 206 to the amplification transistor 207. The second electrically-connecting portion 113 can be constituted by forming the conductivity pattern with the top wiring layer on the first substrate 201 and that on the second substrate 202 and by electrically connecting them to each other.

A well 214 of the first conductivity type is provided with at least a source region and a drain region of the amplification transistor 207 for one pixel. When the NMOS transistor is used for the amplification transistor 207, the conductivity type of the well is a "P" type. When the PMOS transistor is used for the amplification transistor 207, the conductivity type of the well is the "N" type. More specifically, the well is formed of a semiconductor region having the opposite conductivity type of the source region and the drain region.

Each well 214 is electrically separated from the adjacent well in at least one direction. In other words, according to a first exemplary embodiment, one well is provided with the source regions and the drain regions of a plurality of amplification transistors included in one pixel column.

In this case, the adjacent wells provided with the source regions and the drain regions of the amplification transistors included in the pixel column are separated from each other. According to a second exemplary embodiment, one well is provided with the source regions and the drain regions of a plurality of amplification transistors included in one pixel row. In this case, the adjacent wells provided with the source regions and the drain regions of the amplification transistors included in the pixel row are separated from each other.

According to a third exemplary embodiment, one well is provided with the source region and the drain region of the amplification transistor included in one pixel. In this case, the well provided with the source region and the drain region of the amplification transistor included in the pixel is separated from the adjacent wells in the vertical direction and the horizontal direction.

The above-described third exemplary embodiment is a typical example. When the wells are separated for each pixel column and each pixel row, the wells may be further separated within one pixel column and one pixel row.

Herein, "separating the wells" refers to that the semiconductor region of an opposite conductivity type to the adjacent wells 214 is disposed therebetween. Alternatively, in addition to the semiconductor region of the opposite conductivity type, an insulation member may be disposed. A semiconductor region 215 has the second conductivity type that is opposite to that of the well 214.

The semiconductor region 215 of the second conductivity type is disposed between the adjacent wells 214 and electrically separates the wells. For the semiconductor region 215 of the second conductivity type, the semiconductor substrate itself, an epitaxial layer, or a semiconductor region formed by injecting ion can be used.

According to the present invention, on the first substrate 201 on which the photoelectric conversion unit is not disposed, the wells 214 disposed in the pixel region by a predetermined unit are separated. Thus, compared to a case where the photoelectric conversion unit and the pixel circuit are monolithically disposed on one substrate in a conventional manner, a decrease of the light receiving area of the photoelectric conversion unit due to separation of the wells can be suppressed.

Further, in each exemplary embodiment, any one of the effects described below can be acquired.

A first effect is improvement of a gain of the amplification transistor. A second effect is suppression of cross talk via the well 214. A third effect is suppression of increasing an FD capacitance.

More specifically, the present invention will be described in detail with reference to the exemplary embodiment as below.

Example 1

Figure 3:
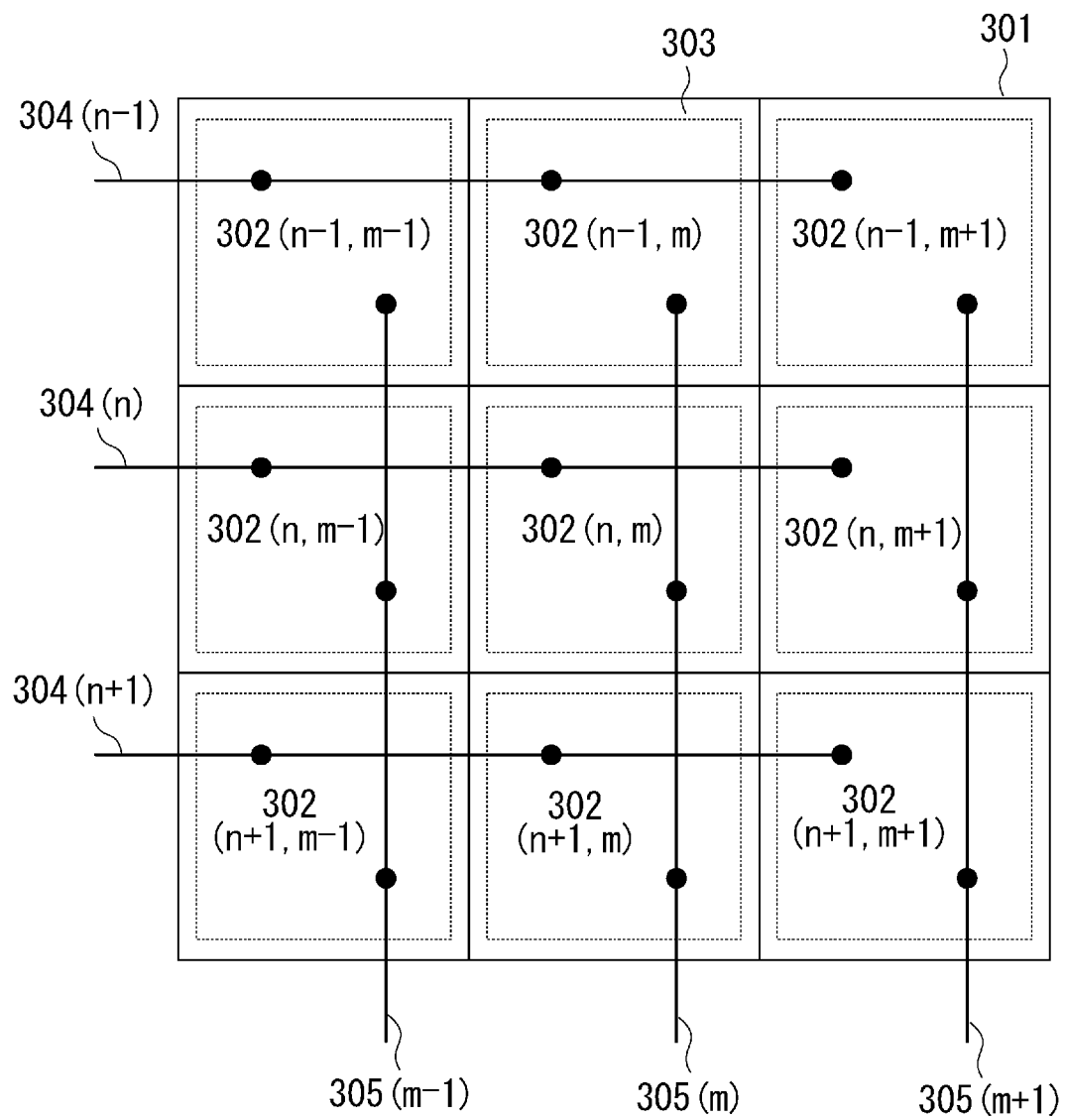
FIG. 3 is a schematic top plan view illustrating a solid-state imaging device according to a first exemplary embodiment.

According to an exemplary embodiment, the wells are separated for each pixel. FIG. 3 is a schematic top plan view illustrating a portion of the pixel circuit disposed on the second substrate. According to the present exemplary embodiment, of the members included in the pixel circuit, a selection transistor for selecting the amplification transistor, the reset transistor, or the pixel is disposed on the second substrate.

A pixel region 301 is disposed on the second substrate. The above-described members included in the pixel are disposed with a predetermined repeating pitch. On the second substrate, the pixel region 301 is separated into a grid-like shape so that the region occupied by one pixel can be schematically illustrated. Each pixel is disposed in a matrix.

Wells 302 of the first conductivity type, which are the "P" type herein, are separated for each pixel. The source regions and the drain regions of the amplification transistors, the reset transistors, and the selection transistors included in one pixel circuit are disposed in each well. The source region and the drain region are formed of the semiconductor region of the second conductivity type that is the opposite conductivity type of the well.

A semiconductor region 303 of the second conductivity type, which is the "N" type herein, is disposed at least between wells 302 to separate the well from the adjacent wells. Further, the semiconductor region 303 of the second conductivity type may be disposed at a bottom portion of each well 302.

A control line 304 supplies a driving pulse to the gate of the reset transistor and the selection transistor included in the pixel circuit. The control line 304 is illustrated with one line in FIG. 3, however, actually two lines for the reset transistor and the selection transistor are disposed for each pixel column. A suffix indicates the row number.

A vertical signal line 305 is used to read out the signals from pixel rows in parallel. The vertical signal line 305 is disposed for each pixel column. A suffix indicates the column number.

Figure 4:
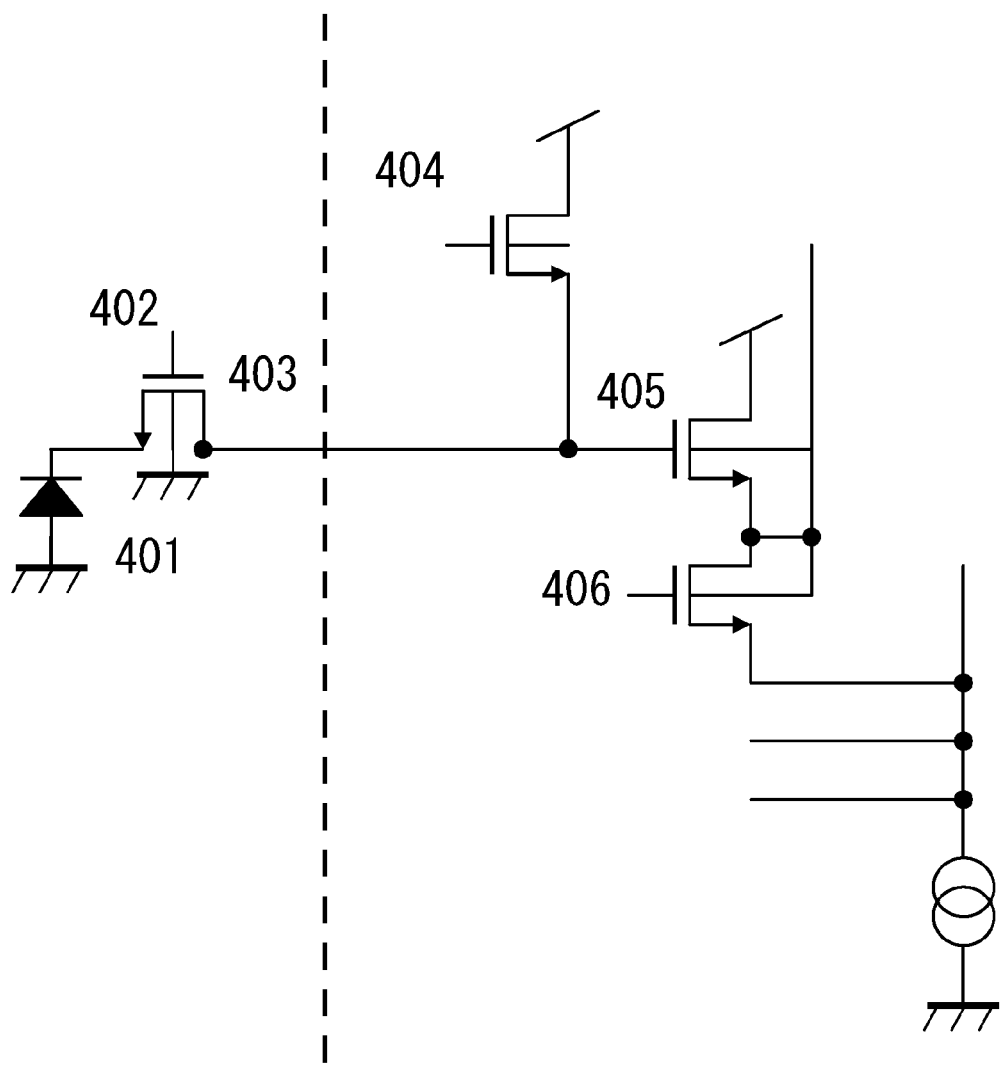
FIG. 4 illustrates an example of an equivalent circuit of a pixel in a solid-state imaging device according to the first exemplary embodiment.

FIG. 4 illustrates an example of an equivalent circuit of one pixel in a solid-state imaging device according to the present exemplary embodiment.

FIG. 4 includes a photoelectric conversion unit 401, a transfer transistor 402 constituting a transfer unit, an FD 403, a reset transistor 404 constituting a pixel reset unit, a amplification transistor 405 constituting the pixel amplifier and a source follower circuit along with the current source, and a selection transistor 406 constituting a pixel selection unit. A difference between FIGS. 1A, 1B and FIG. 4 is that FIG. 4 includes the selection transistor.

The photoelectric conversion unit 401, the transfer transistor 402, and the FD 403 are disposed on the first substrate, and the reset transistor 404, the amplification transistor 405, and a selection transistor 406 are disposed on the second substrate. The reset transistor 404, the amplification transistor 405, and the selection transistor 406 are constituted by the MOS transistor of the "N" type.

Figure 5:
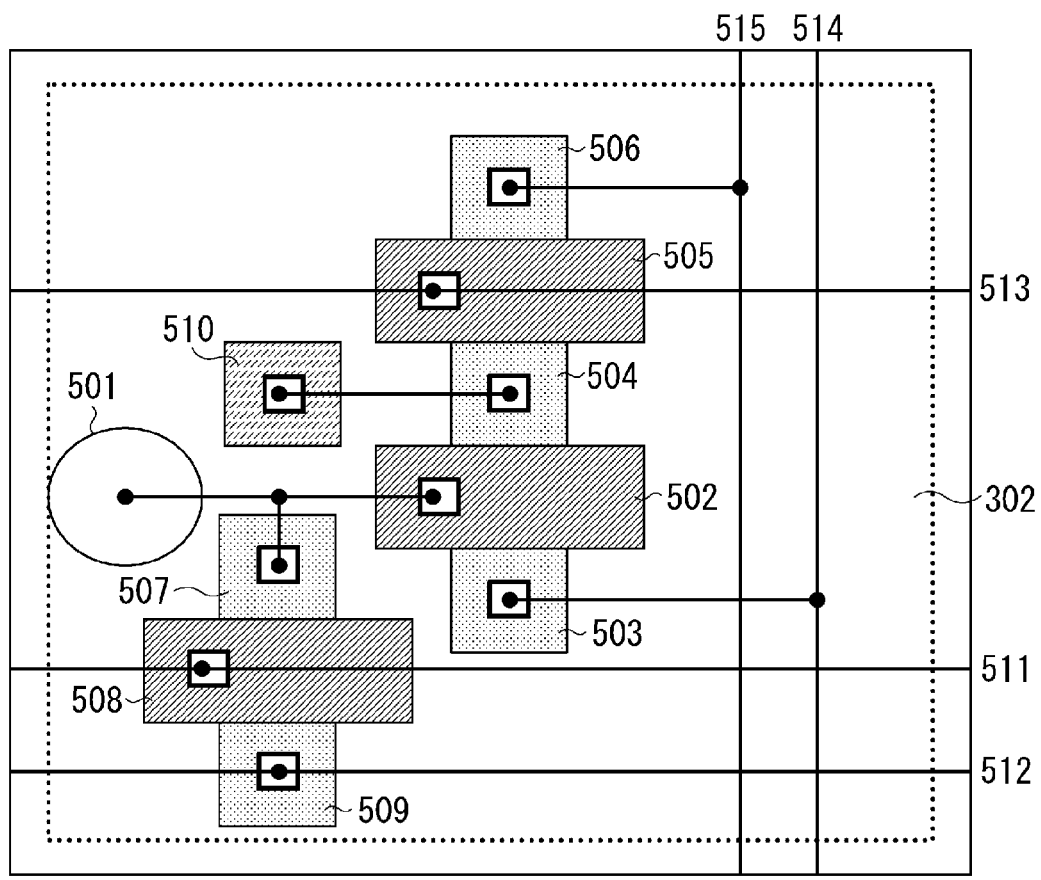
FIG. 5 is a schematic top plan view of one pixel in a solid-state imaging device according to the first exemplary embodiment.

FIG. 5 is a schematic top plan view of the second substrate. Same reference numerals are given to portions having the same functions as those in FIGS. 3 and 4, and detailed descriptions will not be repeated.

An electrically-connecting portion 501 is a portion for electrically connecting the second substrate to the first substrate. Polysilicon 502 forms a gate electrode of the amplification transistor and is electrically connected to the FD disposed on the first substrate via the electrically-connecting portion 501. A source region 503 is included in the amplification transistor. A drain region 504 is included in the amplification transistor and also functions as the source region of the selection transistor.

Polysilicon 505 forms the gate electrode of the selection transistor. A source region 506 is included in the selection transistor. A source region 507 is included in the reset transistor. Polysilicon 508 forms the gate electrode of the reset transistor. A drain region 509 is included in the reset transistor.

A semiconductor region 510 has the same conductivity type as those of the wells 302 and a higher impurity level than the wells 302. Since the semiconductor region 510 has a function for supplying a predetermined voltage to the wells, it is hereinafter referred to as a "well-contact region".

A reset control line 511 supplies a driving pulse to the reset transistor. A reset power source line 512 is a line for supplying a reset voltage to the drain of the reset transistor. A selection control line 513 is a line for supplying the driving pulse to the gate of the selection transistor. A power source line 514 is a line for supplying a drain voltage to the drain of the amplification transistor. A vertical signal line 515 is also disposed on the second substrate.

The amplification transistor performs the source follower operation. The charge generated by the photoelectric conversion unit 401 is supplied to the gate of the amplification transistor via the transfer transistor 402. Based on an amount of the supplied charge, the gate voltage of the amplification transistor is changed. Based on the change of the gate voltage of the amplification transistor, the source voltage of the amplification transistor is changed.

According to the present exemplary embodiment, the well 302 is electrically connected to the drain region 504 of the amplification transistor via the well-contact region 510. Accordingly, the potential of the well 302 changes for each pixel similar to the change of the voltage of the source of the amplification transistor.

With such a structure, it is possible to make the gain of the source follower circuit closer to "1", thereby improving the voltage gain of the source follower circuit. The details will be described below.

Figure 6:
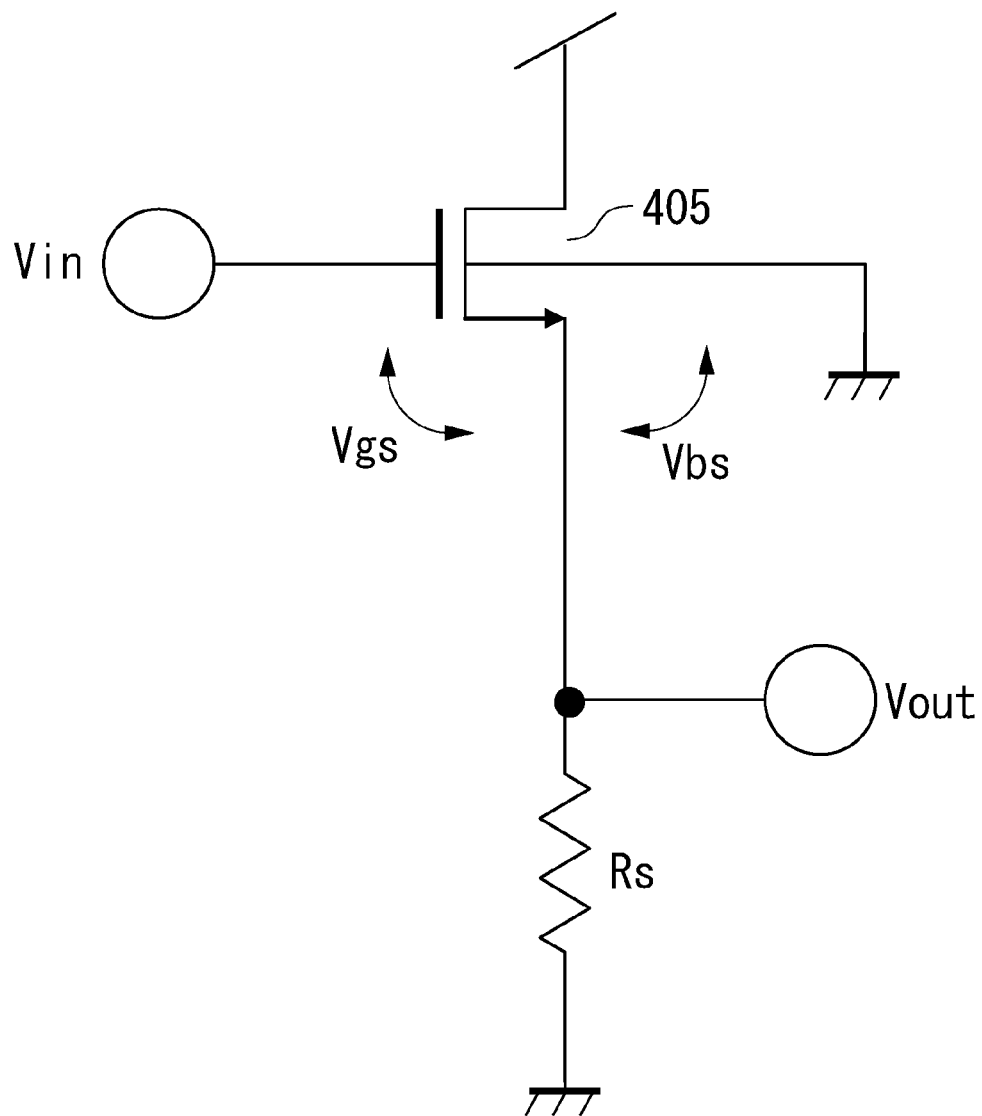
FIG. 6 illustrates an equivalent circuit of a source follower circuit.

FIG. 6 illustrates a case where the well of the amplification transistor is grounded in an alternating-current manner as a comparison example and which is, for example, GND. When the voltage between the gate and the source of the amplification transistor is defined as Vgs, the voltage between the source and the back gate is defined as Vbs, and the load resistance value is defined as Rs, the gain of the source follower circuit can be expressed with Equation 1 as illustrated below.

$$Av = Vin/Vout \quad \text{(Equation 1)}$$
$$= gm \times Rs/(1 + (gm + gmbs) \times Rs)$$

Herein, Av represents the voltage gain of the source follower circuit, and gm and gmbs are respectively expressed as follows.

$$gm = Ids/Vgs$$

$$gmbs = Ids/Vbs$$

When the resistance value of the load resistance is defined as Rs=infinite, the Equation 1 can be modified as illustrated below.

$$Av = gm/(gm+gmbs) \quad \text{(Equation 2)}$$

The value of the Equation 2 is normally within 08 to 0.9. Herein, the source of the amplification transistor is electrically connected to the wells. In other words, when the source of the amplification transistor is connected to the back gate, the equation gmb=0 can be acquired. Thus, the voltage gain at this point is 1.0. Compared with a case where the back gate is grounded in an alternating-current manner as normally, according to the present exemplary embodiment, the higher voltage gain can be acquired.

Figure 7:
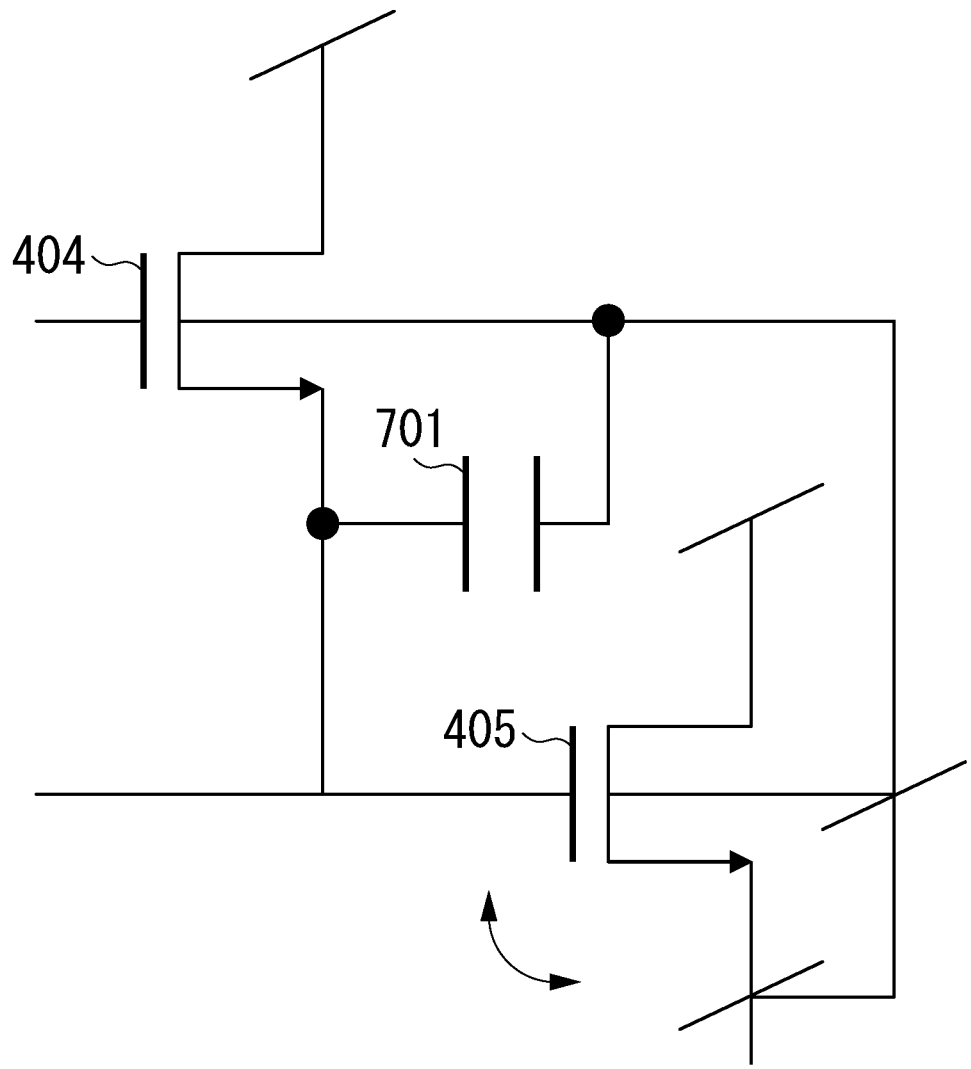
FIG. 7 illustrates an equivalent circuit of an extracted part of a pixel.

Further, if the well electrically connected to the source of the amplification transistor is provided with the reset transistor, the FD capacitance can be decreased. In order to describe such a case, FIG. 7 illustrates a part of a parasitic capacitance generated in the FD. FIG. 7 illustrates the reset transistor and the amplification transistor that are extracted from FIG. 4.

A parasitic capacitance 701 is generated between the FD and the back gate of the reset transistor. When the well and the source of the amplification transistor are electrically connected to each other, the voltage between the gate and the source of the amplification transistor becomes substantially constant despite of the FD potential. Therefore, the parasitic capacitance 701 does not contribute to the FD capacitance. This is because the well changes its voltage similar to that of the source of the amplification transistor.

Thus, by disposing reset transistor in the same well as that of the amplification transistor, the FD capacitance can be reduced, thereby improving sensitivity of the solid-state imaging device.

Further, according to the present exemplary embodiment, the selection transistor is disposed between the vertical output line and the source of the amplification transistor. With such a structure, the selection transistor becomes nonconductive so that influence on the well from the potential change of the vertical output line can be reduced, which is preferable.

As described above, according to the present exemplary embodiment, the wells of the transistor included in the pixel circuit disposed on the second substrate on which the photoelectric conversion unit is not disposed are separated for each pixel. With such a structure, the wells can be separated without decreasing the light receiving area of the photoelectric conversion unit.

Furthermore, by electrically connecting the source of the amplification transistor to the well provided with the amplification transistor, the voltage gain of the amplification transistor can be improved. Moreover, by providing the same well with the reset transistor and the amplification transistor, the FD capacitance can be decreased. Further, by disposing the selection transistor, and by electrically separating the vertical output line from the source of the amplification transistor, the influence on the well from the potential change of the vertical output line can be decreased.

Example 2

A difference between the present exemplary embodiment and the first exemplary embodiment is that the wells are separated between the pixel columns. Regarding the transistor disposed on the second substrate, the wells are separated between the columns of the amplification transistors.

Figure 8:
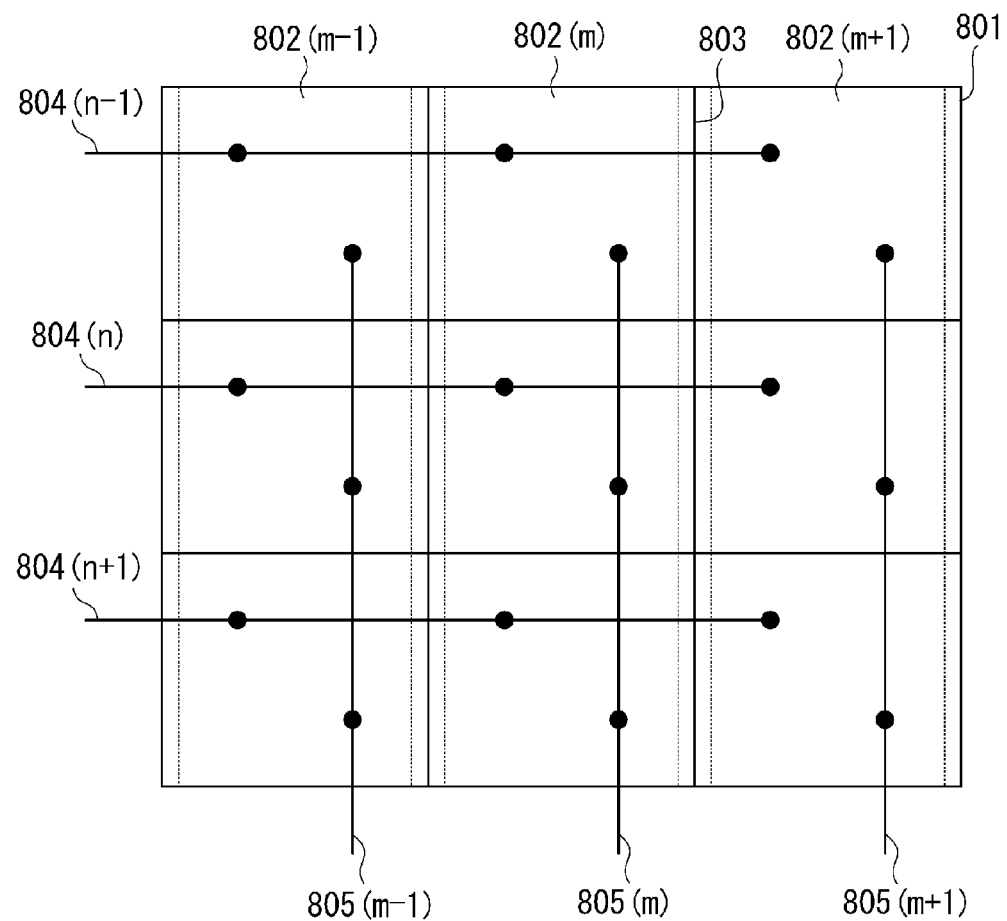
FIG. 8 is a schematic top plan view illustrating a solid-state imaging device according to a second exemplary embodiment.

Furthermore, a difference from the first exemplary embodiment is that the present exemplary embodiment includes no selection transistor. Thus, as the pixel equivalent circuit, the structure illustrated in FIG. 1 can be adopted. FIG. 8 is a schematic top plan view illustrating a solid-state imaging device of a second exemplary embodiment.

A pixel region 801 is disposed on the second substrate. The transistors included in the pixel illustrated with the equivalent circuit diagram are disposed with a predetermined repeating pitch. The pixel region is separated into a grid-like shape so that the region occupied by one pixel can be schematically illustrated. Each pixel is disposed in a matrix.

Wells 802 of the first conductivity type, which are the "P" type herein, are separated for each pixel. Each well is provided with the source regions and the drain regions of a plurality of amplification transistors and a plurality of the reset transistors that are included in one pixel column. The source region and the drain region are formed of the semiconductor regions of the second conductivity type.

A semiconductor region 803 of the second conductivity type, which is the "N" type herein, is disposed in a slit shape at least between wells 802 to separate the wells. Further, the semiconductor region 803 of the second conductivity type may be disposed at the bottom portion of each well 802.

A control line 804 is a line for supplying the driving pulse to the gate of the reset transistor included in the pixel circuit. A suffix indicates the row number.

A vertical signal line 805 is a line for reading the signals from each pixel row in parallel, and is disposed for each pixel column. A suffix indicates the column number.

According to the present exemplary embodiment, in addition to the effect of the first exemplary embodiment, since the wells including the amplification transistor that are disposed adjacent to each other in the vertical direction do not need to be electrically separated from each other, the area for one pixel on the second substrate can be decreased. Further, since no selection transistor is disposed on the second substrate, the area for the selection transistor can be also decreased.

According to the present exemplary embodiment, in order to obtain the structure in which no selection transistor is disposed, the wells may be separated at least between a plurality of pixels that simultaneously perform reading. The signals of a plurality of pixels included in the same pixel row are substantially simultaneously read by the corresponding vertical output line.

More specifically, a plurality of pixel signals included in a certain pixel row are substantially simultaneously read. Thus, the wells are separated for each pixel column and, then, the adjacent pixels in the same pixel row are disposed in the different wells.

Example 3

Figure 9:
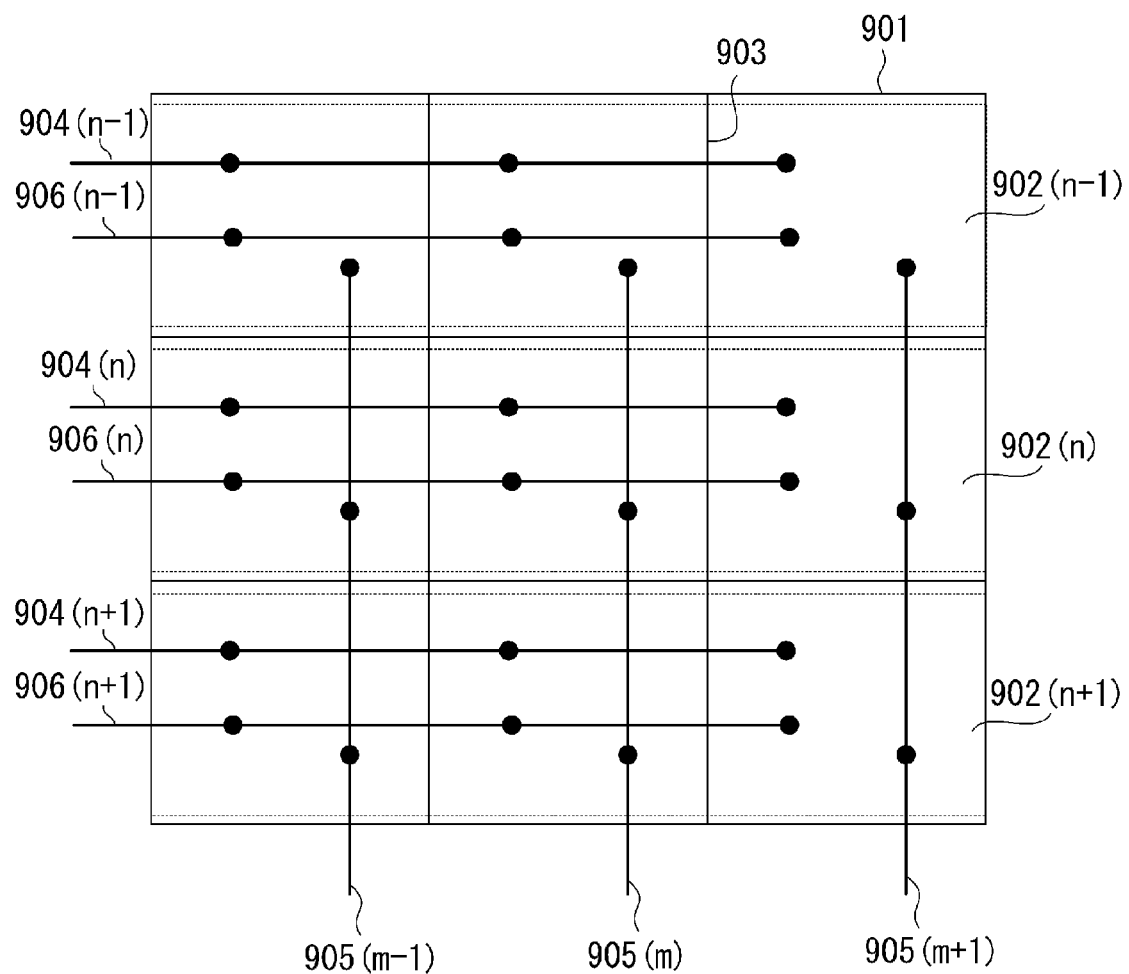
FIG. 9 is a schematic top plan view illustrating a solid-state imaging device according to a third exemplary embodiment.

A difference between the present exemplary embodiment and the first and second exemplary embodiments is that the wells are separated from each other by a pixel row unit. Regarding the transistor disposed on the second substrate, the wells are separated from each other between the rows of the amplification transistors. FIG. 9 is a schematic top plan view illustrating the second substrate of a solid-state imaging device of the present exemplary embodiment.

A pixel region 901 is disposed on the second substrate. The transistors included in the pixel indicated in the equivalent circuit diagram are disposed with a predetermined repeating pitch. The pixel region is separated into a grid-like shape so that the region occupied by one pixel can be schematically illustrated. Each pixel is disposed in a matrix.

Wells 902 of the first conductivity type, which are the "P" type herein, are separated for each pixel. A suffix indicates the row number. The source regions and the drain regions of a plurality of the amplification transistors and a plurality of the reset transistors included in one pixel row are disposed in each well. The source region and the drain region are formed of the semiconductor region of the second conductivity type.

A semiconductor region 903 of the second conductivity type, which is the "N" type herein, is disposed in a slit-like shape at least between wells 902 to separate the wells. Further, the semiconductor region 903 of the second conductivity type may be disposed at the bottom portion of each well 802.

A control line 904 is a line for supplying a driving pulse to a gate of the reset transistor included in the pixel circuit. A suffix indicates the row number.

A vertical signal line 905 is a line for reading the signals from the pixel rows in parallel and arranged for each pixel column. A suffix indicates the column number.

A control line 906 is a line for supplying at least a first voltage and a second voltage to the wells separated for each pixel row. A predetermined voltage is supplied to the control line 906 from a voltage supply unit (not illustrated). The voltage supply unit includes, for example, a vertical scanning circuit, a timing generator, and a power source supply unit.

According to the present exemplary embodiment, by selectively supplying the first voltage or the second voltage for the control line 906 according to a reading pixel row or a non-reading pixel row, the pixel can be selected. More specifically, by changing a threshold value of the amplification transistor by the voltage supplied to the well, the pixel is selected.

When the MOS transistor of the "N" type is used for the amplification transistor, the first voltage is supplied to the well of the reading pixel row and the second voltage, which is higher than the first voltage, is supplied to the non-reading pixel row. With this arrangement, the signals of the reading pixel row is read out to the vertical output line selectively.

As described above, the present invention has been specifically described with reference to the exemplary embodiments, and the present invention can be appropriately combined and various modifications can be made without departing from the spirit or scope of the inventive concept. For example, in each exemplary embodiment, the transistor of the conductivity type of the "N" type included in the pixel circuit is described, however, the transistor of a "P" type can be also used. In this case, each semiconductor region may have the opposite conductivity type.

Further, a case where, of the electrons and the holes generated by the photoelectric conversion unit, the electrons are used as the signal charge has been described, and the holes can be also used. Further, by locally disposing a region having the high impurity density as the semiconductor region for separating the wells, the separation characteristic may be enhanced.

Furthermore, the row and the column described in the exemplary embodiments are used for the sake of convenience of the description, thus they may be replaced with each other.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-151973, filed Jul. 2, 2010, which is hereby incorporated by reference herein in its entirety.

REFERENCE SIGNS LIST 101 photoelectric conversion unit
105 amplification transistor
214 well of first conductivity type
215 semiconductor region of second conductivity type

The invention claimed is:

1. A solid-state imaging device comprising:
a plurality of pixels, each including a photoelectric conversion unit and a amplification transistor configured to amplify a signal generated by the photoelectric conversion unit;
a first substrate on which the plurality of the photoelectric conversion units are disposed; and
a second substrate on which the plurality of the amplification transistors are disposed,
wherein a well of a first conductivity type provided with a source region and a drain region of the amplification transistor is isolated from another well of a first conductivity type which is disposed adjacent to the well in at least one direction, the another well is provided with a source region and a drain region of another amplification transistor,
wherein, between the adjacent wells of the first conductivity type, by disposing a semiconductor region of a second conductivity type, the wells of the first conductivity type are isolated from each other, and wherein the semiconductor region of the second conductivity type covers a surface which is opposite to a surface on which a gate of the amplification transistor of the two wells of the first conductivity type is provided and extends to a region between the two wells of the first conductivity type.

2. The solid-state imaging device according to claim 1, wherein a source of the amplification transistor and the well of the first conductivity type are electrically connected to each other.

3. The solid-state imaging device according to claim 1, further comprising a plurality of reset transistors each configured to reset a voltage of an input node of the amplification transistor,
wherein the plurality of the reset transistors are respectively disposed on the isolated wells of the first conductivity type including the amplification transistors included in the same pixel.

4. The solid-state imaging device according to claim 1, wherein each pixel includes a selection transistor, and
wherein a plurality of the selection transistors are respectively disposed on the isolated wells of the first conductivity type including the amplification transistor in the same pixel.

5. The solid-state imaging device according to claim 1, wherein the amplification transistors are disposed in a matrix, and the wells of a first conductive type are isolated from each other between columns of a plurality of amplification transistors.

6. The solid-state imaging device according to claim 1, wherein the amplification transistors are disposed in a matrix, and the wells of the first conductivity type are isolated from each other between rows of a plurality of the amplification transistors, the solid-state imaging device further comprising a voltage supply unit configured to supply a first voltage and a second voltage that is higher than the first voltage for each of the isolated wells.

7. The solid-state imaging device according to claim 1, wherein the wells of the first conductive type are isolated for each pixel.

8. The solid-state imaging device according to claim 1, wherein a source follower circuit is configured with the amplification transistor and a power source.

9. A solid-state imaging device comprising:
a plurality of pixels, each including a photoelectric conversion unit and a amplification transistor configured to amplify a signal generated by the photoelectric conversion unit;
a first substrate on which the plurality of the photoelectric conversion units are disposed; and
a second substrate on which the plurality of the amplification transistors are disposed,
wherein a well of a first conductivity type provided with a source region and a drain region of the amplification transistor is isolated from another well of a first conductivity type which is disposed adjacent to the well in at least one direction, the another well is provided with a source region and a drain region of another amplification transistor,
wherein, between the adjacent wells of the first conductivity type, by disposing a semiconductor region of a second conductivity type, the wells of the first conductivity type are isolated from each other,
wherein a source of the amplification transistor and the well of the first conductivity type are electrically connected to each other, wherein the amplification transistors are disposed in a matrix, and the wells of a first conductive type are isolated from each other between columns of a plurality of amplification transistors, and wherein the semiconductor region of the second conductivity type covers a surface which is opposite to a surface on which a gate of the amplification transistor of the two wells of the first conductivity type is provided and extends to a region between the two wells of the first conductivity type.

* * * * *